US011549844B2

(12) United States Patent
Tsunoda

(10) Patent No.: US 11,549,844 B2
(45) Date of Patent: Jan. 10, 2023

(54) INFRARED DETECTOR AND IMAGING DEVICE USING THE SAME

(71) Applicant: FUJITSU LIMITED, Kawasaki (JP)

(72) Inventor: Koji Tsunoda, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 66 days.

(21) Appl. No.: 16/888,894

(22) Filed: Jun. 1, 2020

(65) Prior Publication Data

US 2020/0393293 A1 Dec. 17, 2020

(30) Foreign Application Priority Data

Jun. 17, 2019 (JP) ............................ JP2019-112194

(51) Int. Cl.
*G01J 1/42* (2006.01)
*G01J 1/04* (2006.01)
*G01J 1/44* (2006.01)
*H01L 27/146* (2006.01)
(Continued)

(52) U.S. Cl.
CPC ........... *G01J 1/4228* (2013.01); *G01J 1/0488* (2013.01); *H01L 27/1465* (2013.01); *H01L 27/14652* (2013.01); *H01L 31/03046* (2013.01); *H01L 31/035236* (2013.01); *G01J 2001/448* (2013.01)

(58) Field of Classification Search
CPC .. G01J 1/4228; G01J 1/0488; G01J 2001/448; G01J 1/1626; G01J 2001/1652; G01J 1/16; G01J 1/42; H01L 27/14652; H01L 31/03046; H01L 31/035236; H01L 27/1465; H01L 31/02327; H01L 31/0304; H01L 31/1013

See application file for complete search history.

(56) References Cited

U.S. PATENT DOCUMENTS

| 7,129,489 | B2 * | 10/2006 | Pham ................ H01L 31/02966 |
|---|---|---|---|
| | | | 257/E27.137 |
| 8,624,189 | B2 * | 1/2014 | Inada ................... G01N 21/359 |
| | | | 250/338.4 |
| 10,236,319 | B2 * | 3/2019 | Suzuki ............. H01L 31/02327 |

(Continued)

FOREIGN PATENT DOCUMENTS

| CN | 112490310 A | * | 3/2021 |
|---|---|---|---|
| JP | 2004-111548 A | | 4/2004 |
| JP | 2015-038977 A | | 2/2015 |

OTHER PUBLICATIONS

Gautam et al., Three color infrared detector using InAs/GaSb superlattices with unipolar barriers, Mar. 23, 2011, Applied Physics Letters vol. 98 pp. 121106-1 to 121106-3. (Year: 2011).*

*Primary Examiner* — Christine S. Kim

(74) *Attorney, Agent, or Firm* — Fujitsu Patent Center

(57) ABSTRACT

An infrared detector includes: a first light receiving layer having a first cutoff wavelength; a second light receiving layer having a second cutoff wavelength longer than the first cutoff wavelength; an intermediate filter layer having a third cutoff wavelength that is the same as or longer than the first cutoff wavelength and the same as or shorter than the second cutoff wavelength, the intermediate filter layer being disposed between the first light receiving layer and the second light receiving layer; a first barrier layer disposed between the first light receiving layer and the intermediate filter layer; and a second barrier layer disposed between the second light receiving layer and the intermediate filter layer.

8 Claims, 17 Drawing Sheets

(51) Int. Cl.
*H01L 31/0304* (2006.01)
*H01L 31/0352* (2006.01)

(56) References Cited

U.S. PATENT DOCUMENTS

| | | | |
|---|---|---|---|
| 2012/0217475 A1* | 8/2012 | Leavitt | H01S 5/3422 |
| | | | 257/14 |
| 2015/0014537 A1 | 1/2015 | Rajavel et al. | |
| 2021/0225941 A1* | 7/2021 | Huang | H01L 31/1013 |
| 2021/0305307 A1* | 9/2021 | Huang | H01L 27/14694 |

* cited by examiner

INFRARED RAYS

INFRARED DETECTOR AND IMAGING DEVICE USING THE SAME

CROSS-REFERENCE TO RELATED APPLICATION

This application is based upon and claims the benefit of priority of the prior Japanese Patent Application No. 2019-112194, filed on Jun. 17, 2019, the entire contents of which are incorporated herein by reference.

FIELD

The present embodiment discussed herein is related to an infrared detector and an imaging device using the same.

BACKGROUND

A Type II Superlattice (T2SL) epitaxially grown on a compound semiconductor substrate is formed by repeatedly laminating different crystal materials having a lattice constant close to the substrate in a short period. There is an advantage such that, since infrared rays can be absorbed by transition between minibands formed in the superlattice, a quantum efficiency is high. In the T2SL, a cutoff wavelength can be changed by controlling a film thickness of a material forming the superlattice. For example, from middle-wavelength infrared rays (3 to 5 µm) to long-wavelength infrared rays (8 to 12 µm), it is relatively easy to design a wavelength to be detected.

A configuration is proposed that detects two-wavelength infrared light by a single element by using two T2SLs having sensitivity with respect to different wavelengths as light receiving layers and disposing a barrier layer between the two light receiving layers.

FIG. 1 illustrates a known two-wavelength detection element. A first absorption layer 202, a barrier layer 204, a second absorption layer 206, and an interface layer 208 are disposed in this order, and the second absorption layer 206 is connected to a reading chip by the interface layer 208. Light enters from a side of the first absorption layer 202 having a large band gap. By switching polarities of biases applied to the first absorption layer 202 and the second absorption layer 206, light having a first wavelength and light having a second wavelength are detected.

Examples of the related art include Japanese Laid-open Patent Publication No. 2015-38977

SUMMARY

According to an aspect of the embodiments, an infrared detector includes: a first light receiving layer having a first cutoff wavelength; a second light receiving layer having a second cutoff wavelength longer than the first cutoff wavelength; an intermediate filter layer having a third cutoff wavelength that is the same as or longer than the first cutoff wavelength and the same as or shorter than the second cutoff wavelength, the intermediate filter layer being disposed between the first light receiving layer and the second light receiving layer; a first barrier layer disposed between the first light receiving layer and the intermediate filter layer; and a second barrier layer disposed between the second light receiving layer and the intermediate filter layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT(S)

In a configuration of a typical two-wavelength detection element, there is a case where light having a wavelength other than the second wavelength is detected by the long-wavelength side second absorption layer. For example, light having a wavelength between the first wavelength and the second wavelength caused by background radiation, radiation from a housing, or the like may be detected. Furthermore, since the second absorption layer has the sensitivity to the first wavelength, the second absorption layer absorbs the light having the first wavelength that is not absorbed by the first absorption layer. A crosstalk occurs due to the absorption of the light having a wavelength other than a target wavelength, and a Signal-to-Noise (S/N) ratio relative to the target wavelength is deteriorated. The deterioration in the S/N ratio deteriorates independence of a detection signal of light having each wavelength and deteriorates detection accuracy.

According to an aspect of the embodiments, provided are solutions to suppress the deterioration in the S/N ratio of the detection signal relative to the target wavelength and improve the detection accuracy by an infrared detector.

It is possible for an infrared detector to suppress deterioration in an S/N ratio of a detection signal and improve detection accuracy.

A two-wavelength detection element that detects infrared rays having two wavelengths by a single element can improve detection accuracy of a temperature distribution and improve measurement accuracy in comparison with an infrared sensor having a single wavelength by executing processing such as fusion or correlation on signals detected in different wavelengths.

Since an element that detects long-wavelength infrared rays has a small band gap, a dark current easily flows. To reduce the dark current, a configuration is considered in which a light receiving layer and a barrier layer having the same polarity such as nBn and pBp are combined without using pn-junction for a light receiving element.

Figure 2:
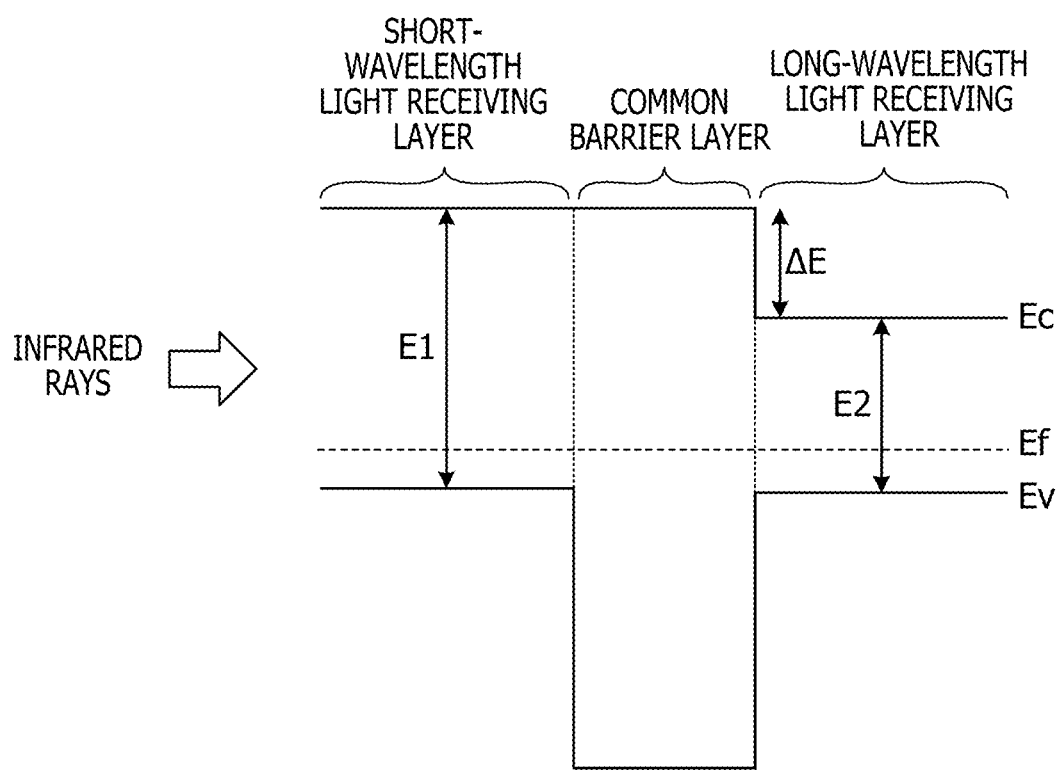
FIG. 2 is an energy band diagram of a two-wavelength detection element having a pBp structure.

FIG. 2 is an energy band diagram of a two-wavelength detection element having a pBp structure. The barrier layer is inserted between a short-wavelength light receiving layer and a long-wavelength light receiving layer, and the barrier layer is shared by the two light receiving layers. Light enters from a side of the short-wavelength light receiving layer having an energy band gap E1. Electrons generated by the light absorbed by the short-wavelength light receiving layer are extracted to outside by applying a positive bias to the side of the long-wavelength light receiving layer.

The long-wavelength light receiving layer has an energy band gap E2 smaller than E1 and absorbs light having a wavelength determined on the basis of E2. Electrons generated by light absorbed by the long-wavelength light receiving layer are extracted to outside by applying a positive bias to the side of the short-wavelength light receiving layer.

Figure 3:
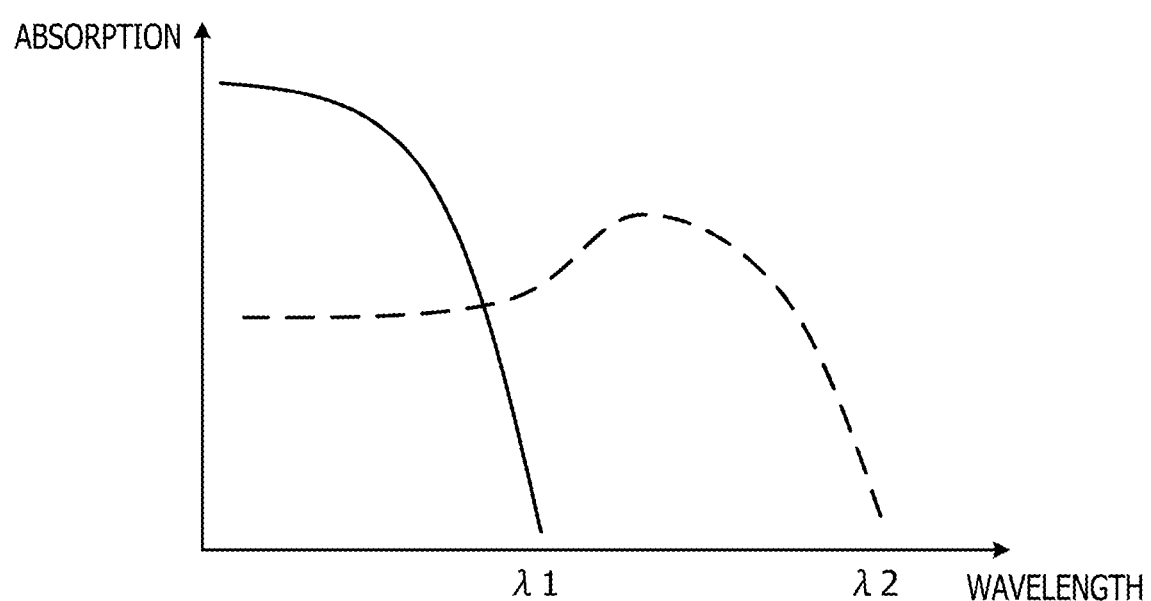
FIG. 3 is a schematic diagram illustrating spectral sensitivity characteristics of a cutoff wavelength type two-wavelength detection element.

FIG. 3 illustrates spectral sensitivity characteristics of a T2SL two-wavelength detection element. A light receiving layer formed by the T2SL has cutoff wavelength type spectral sensitivity characteristics for detecting light having a wavelength equal to or less than a specific wavelength. A cutoff wavelength of the short-wavelength light receiving layer indicated by a solid line is $\lambda 1$, and a cutoff wavelength of the long-wavelength light receiving layer indicated by a broken line is $\lambda 2$. As can be understood from the spectral sensitivity characteristics, in the long-wavelength light receiving layer, light that is emitted from background, a housing, or the like and has a wavelength between $\lambda 1$ and $\lambda 2$ is detected. Furthermore, since the long-wavelength light receiving layer has sensitivity to light having a wavelength shorter than $\lambda 1$, the light having the wavelength shorter than $\lambda 1$ that has not been absorbed by the short-wavelength light receiving layer is absorbed by the long-wavelength light receiving layer.

When detection signals of these pieces of extra light are mixed into detection signals of the long-wavelength light receiving layer, a crosstalk occurs, and an S/N ratio is deteriorated. This problem is not caused in a quantum well type or quantum dot type element having peak wavelength type spectral sensitivity characteristics as illustrated in FIG. 4.

Figure 4:
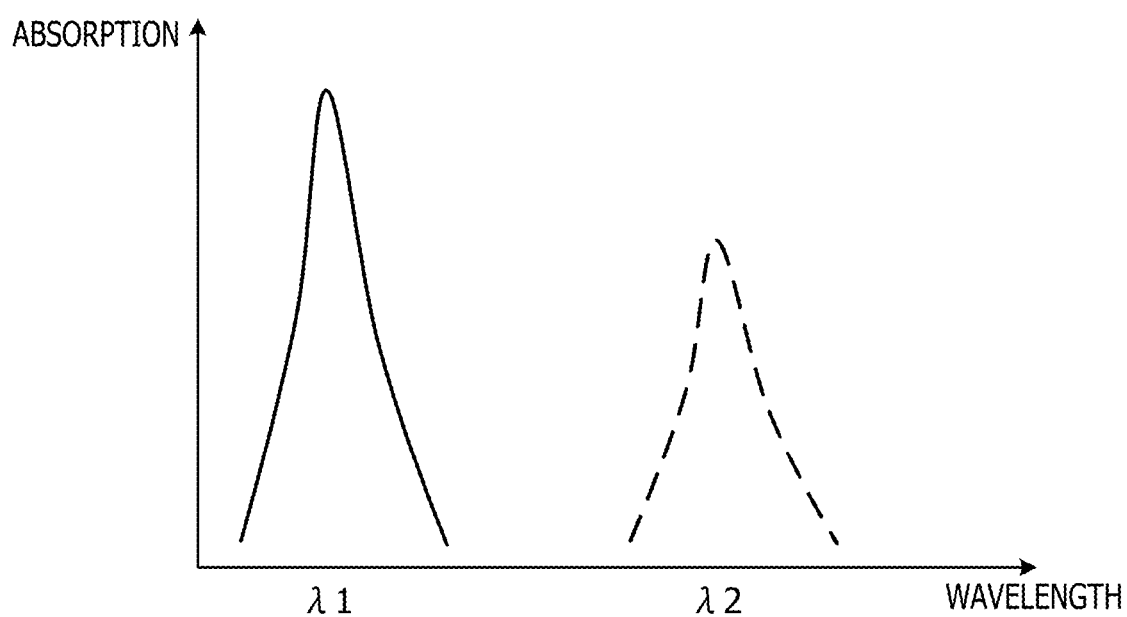
FIG. 4 is a schematic diagram illustrating spectral sensitivity characteristics of a peak wavelength type two-wavelength detection element.

In FIG. 4, a photocurrent according to light absorption flows due to a transition between discrete energy levels in a quantum well or a quantum dot. By designing an energy difference between a ground level and an excitation level, spectral sensitivity characteristics having a peak in a target wavelength can be obtained.

On the other hand, in the T2SL, two or more different crystal materials are repeatedly laminated at a short period, and a miniband including electrons and holes and corresponding to the superlattice is formed. Since light having energy larger than the smallest energy difference between the minibands is absorbed, the cutoff wavelength type spectral sensitivity characteristics are obtained as in FIG. 3. In the element having the peak wavelength type spectral sensitivity characteristics in FIG. 4, an effect of the crosstalk is small. However, due to excellent quantum efficiency and controllability of wavelength sensitivity, an infrared detector using the T2SL is desirable.

Returning to FIG. 2, it is desirable for the barrier layer disposed between the two light receiving layers to have a sufficient film thickness in order to suppress majority carriers or movement of surface leak components. However, there is a problem in that it is difficult to make the barrier layer be thick. In the pBp structure and the nBn structure, the polarities of the two light receiving layers and the barrier layer are set to be the same. When the barrier layer having a large band gap is thickened, in a case of the pBp structure, a band offset indicated by $\Delta E$ occurs in a conduction bands In a case of the nBn structure, unlike FIG. 2, the conduction band of the barrier layer protrudes upward in the drawing, and a band offset occurs in a valance band.

As illustrated in FIG. 2, when a band offset with respect to minority carriers occurs, a bias voltage applied to extract carriers generated in the light receiving layer increases, and the dark current increases, and the S/N ratio is deteriorated. It is desired to solve the deterioration in the S/N ratio due to the effect of the crosstalk, the increase in the applied bias, or the like and realize an infrared detector having high measurement accuracy.

In the following embodiment, the barrier layer is divided into two or more sub barrier layers, and a filter layer having a cutoff wavelength equal to or more than a first cutoff wavelength and equal to or less than a second cutoff wavelength is inserted between the sub barrier layers so that measurement accuracy of a two wavelength type infrared detector is improved.

Figure 5:
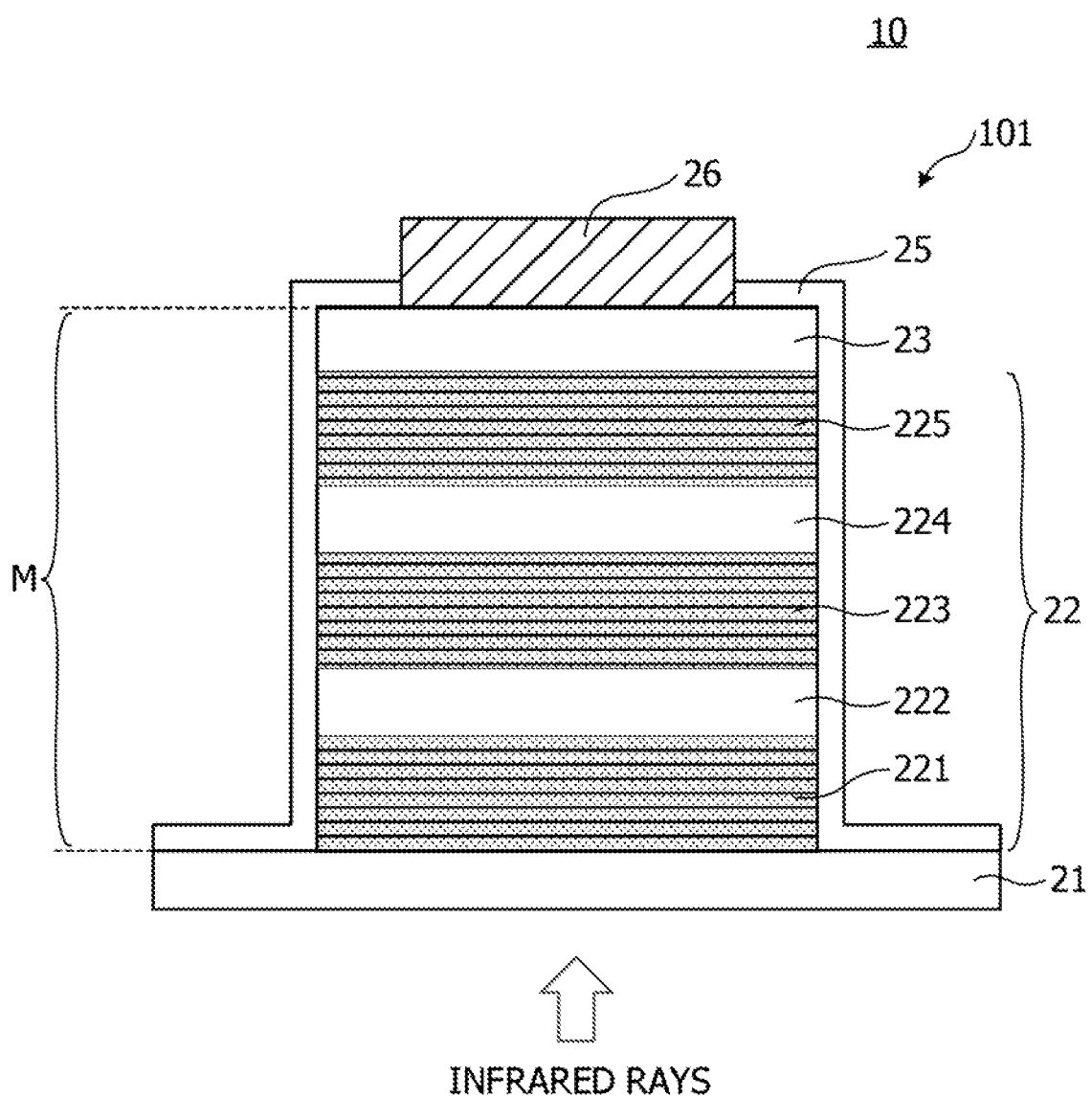
FIG. 5 is a schematic diagram illustrating a basic configuration of an infrared detection element according to an embodiment.

FIG. 5 illustrates a basic configuration of a light receiving element 10 according to an embodiment. The light receiving element 10 includes a pixel 101 that forms a pixel array of an infrared detector. The light receiving element 10 includes a light absorption layer 22 that detects light having a plurality of wavelengths.

The light absorption layer 22 includes a first light receiving layer 221 having the first cutoff wavelength, a first barrier layer 222, an intermediate filter layer 223, a second barrier layer 224, and a second light receiving layer 225 having the second cutoff wavelength, and these layers are laminated in this order. The barrier layer positioned between the first light receiving layer 221 and the second light receiving layer 225 is divided into the first barrier layer 222 and the second barrier layer 224, and the intermediate filter layer 223 is disposed between the first barrier layer 222 and the second barrier layer 224. The intermediate filter layer 223 has a cutoff wavelength equal to or more than a first wavelength and equal to or less than a second wavelength. In this example, the first wavelength is shorter than the second wavelength, and the light enters from the side of the first light receiving layer 221.

In FIG. 5, for simplicity of illustration, the light absorption layer 22 is illustrated and disposed between a buffer layer 21 and a cap layer 23. However, other layer such as a semiconductor electrode layer or an etching stopper layer may be disposed between the buffer layer 21 and the light absorption layer 22 and between the light absorption layer 22 and the cap layer 23. Alternatively, a part of the buffer layer 21 or a part of the cap layer 23 may function as a semiconductor electrode layer, A mesa M including the cap layer 23 and the light absorption layer 22 forms an individual pixel 101 and is covered with a protection film 25, The buffer layer 21 is connected to a large number of pixels included in the pixel array in common.

A part of the protection film 25 on the upper portion of the mesa M is removed, and the cap layer 23 is connected to an upper electrode 26. Here, "upper portion" or "upper surface" means an upper side in a lamination direction or a growth direction in a film forming process of the infrared detector, Therefore, even in a case where the infrared detector is disposed in a reverse direction due to flip chip mounting or the like, an upper side as viewed in the lamination direction or the growth direction is "upper portion" or "upper surface".

As will be described later, at the time of mounting, a projecting electrode such as a bump is disposed on the upper electrode 26, and the pixel array is connected to a reading circuit by the projecting electrode.

Of light that has entered from a rear surface of the buffer layer 21, the light having the wavelength equal to or less than the first wavelength is absorbed by the first light receiving layer 221. Of light that has not been absorbed by and has transmitted the first light receiving layer 221, light having a wavelength shorter than the cutoff wavelength of the intermediate filter layer 223 is absorbed by the intermediate filter layer 223. Before the light enters the second light receiving layer 225, the light having the first wavelength that causes the crosstalk and a wavelength component between the first wavelength and the second wavelength caused by housing radiation or the like are reduced in advance. With this reduction, an optical crosstalk to the second light receiving layer 225 is reduced.

Figure 6:
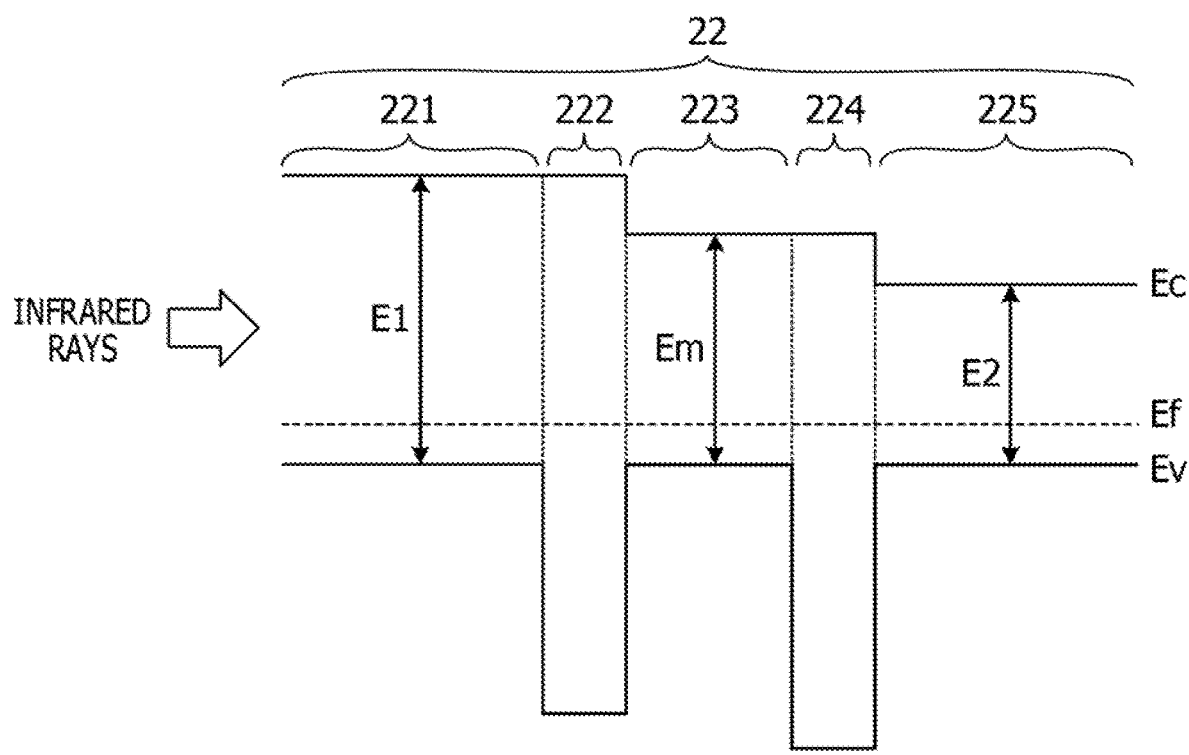
FIG. 6 is an energy band diagram of the infrared detection element in FIG. 5.

FIG. 6 is an energy band diagram of the light receiving element 10 in FIG. 5. An energy band gap Em of the intermediate filter layer 223 is smaller than the energy band gap E1 of the first light receiving layer 221 and is larger than the energy band gap E2 of the second light receiving layer 225.

The first barrier layer 222 and the second barrier layer 224 have energy band gaps larger than those of the first light receiving layer 221, the intermediate filter layer 223, and the second light receiving layer 225.

Polarities of operating carriers of the first light receiving layer 221, the intermediate filter layer 223, the second light receiving layer 225, the first barrier layer 222, and the second barrier layer 224 are the same. In the example in FIG. 6, the light absorption layer 22 has a pBpBp structure. With this structure, by applying a bias to an electrode layer adjacent to each of the first light receiving layer 221 and the second light receiving layer 225, the operating carrier having the polarity different from that of the majority carrier in the light receiving layer (electrons generated by light absorption in example in FIG. 6) can be extracted to the electrode layer. Holes generated in the intermediate filter layer 223 is not extracted to outside. Therefore, an electron-hole pair generated by absorbing infrared rays in a steady state disappears by recombination.

It is preferable that carrier concentration of each of the first barrier layer 222, the intermediate filter layer 223, and the second barrier layer 224 be lower than carrier concentrations of the first light receiving layer 221 and the second light receiving layer 225. For example, when impurity concentration of each of the first light receiving layer 221 and the second light receiving layer 225 is a $10^{16}$ cm$^{-3}$ order, impurity concentration of each of the first barrier layer 222, the intermediate filter layer 223, and the second barrier layer 224 is a $10^{15}$ cm$^{-3}$ order.

In a case where the first barrier layer 222, the intermediate filter layer 223, and the second barrier layer 224 are formed by using the superlattice, it is not needed to introduce impurities to all thin films included in the superlattice, and impurities may be introduced into only a specific layer for each n periods (n is integer equal to or more than one) or ununiformly, With this operation, in each of the first barrier layer 222, the intermediate filter layer 223, and the second barrier layer 224, or when the three layers are viewed as a whole, the impurity concentration can be lowered.

By setting the impurity concentration of each of the first barrier layer 222, the intermediate filter layer 223, and the second barrier layer 224 to be lower than the impurity concentration of each of the first light receiving layer 221 and the second light receiving layer 225, the band offset with respect to the minority carriers caused by light absorption or energy barriers can be minimized. This reduces a bias voltage applied to the light receiving element 10. This will be described later with reference to FIGS. 8A and 8B. By removing the band offset with respect to the minority carrier, the thicknesses of the first barrier layer 222 and the second barrier layer 224 are increased to suppress the dark current, and it is possible to suppress the deterioration in the S/N ratio.

Figure 7:
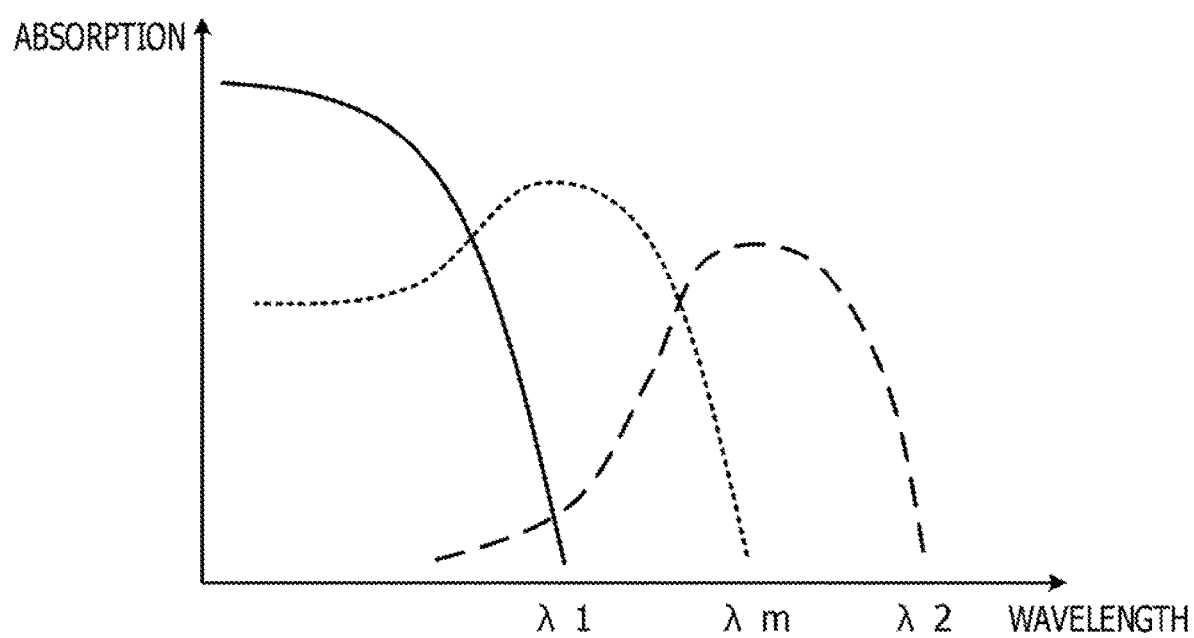
FIG. 7 is a schematic diagram illustrating spectral sensitivity characteristics of an element structure according to the embodiment.

FIG. 7 illustrates spectral sensitivity characteristics of the light receiving element 10 in FIG. 5. A solid line indicates absorption characteristics of the first light receiving layer 221, a broken line indicates absorption characteristics of the second light receiving layer 225, and a dotted line indicates absorption characteristics of the intermediate filter layer 223. The intermediate filter layer 223 has a cutoff wavelength λm between the cutoff wavelength λ1 of the first light receiving layer 221 and the cutoff wavelength λ2 of the second light receiving layer 225. Light having a wavelength, which is shorter than λm, including λ1 is absorbed by the intermediate filter layer 223. The light having the wavelength between λ1 and λ2 emitted from the background, the housing, or the like is reduced, and an optical crosstalk with respect to λ2 is reduced.

Figure 8A:
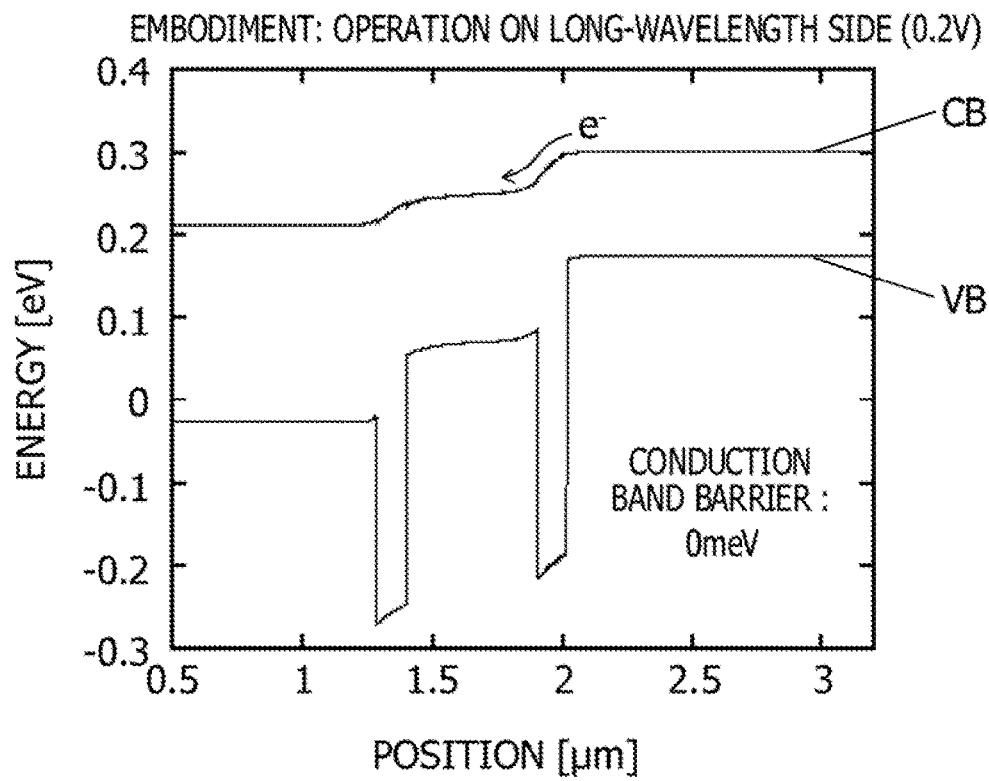
FIG. 8A is an energy band diagram according to calculation by the typical two-wavelength detection element.

FIG. 8A is an energy band diagram according to calculation by the light receiving element 10 according to the embodiment including the light absorption layer 22 in FIG. 5. Here, to extract electrons generated in the long-wavelength second light receiving layer 225, 0.2 V of a positive bias is applied to the side of the first light receiving layer 221. The impurity concentration of each of the first light receiving layer 221 and the second light receiving layer 225 is 1×10$^{16}$ cm$^{-3}$, and the impurity concentration of each of the first barrier layer 222, the intermediate filter layer 223, and the second barrier layer 224 is 1×10$^{15}$ cm$^{-3}$.

The horizontal axis indicates a position in the lamination direction, the left end indicates a light incident side, and the right end indicates the side of the second light receiving layer 225. Two barriers protruding downward in a valance band VB correspond to the first barrier layer 222 and the second barrier layer 224.

In a conduction band CB, there is no energy barriers or band offset perceived by the electrons generated in the second light receiving layer 225, and the electrons effectively move to the side of the first light receiving layer to which the positive bias is applied.

Figure 1:
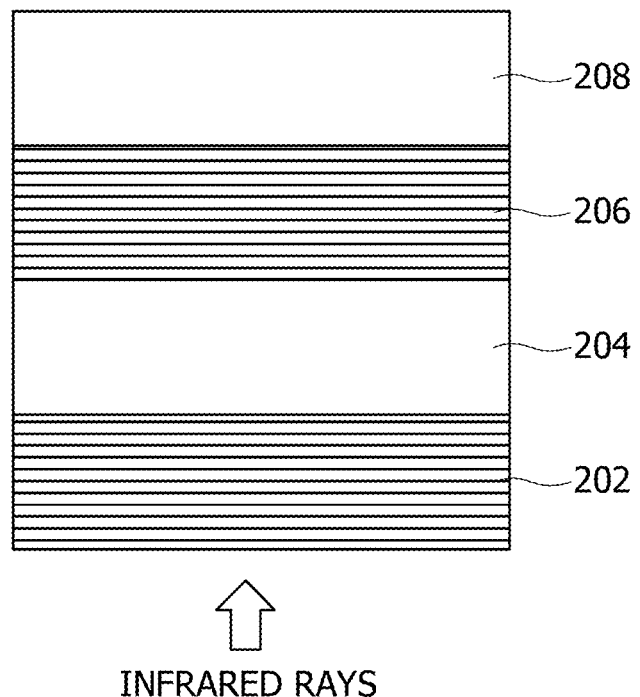
FIG. 1 is a schematic diagram illustrating a configuration of a typical two-wavelength detection element.
Figure 8B:
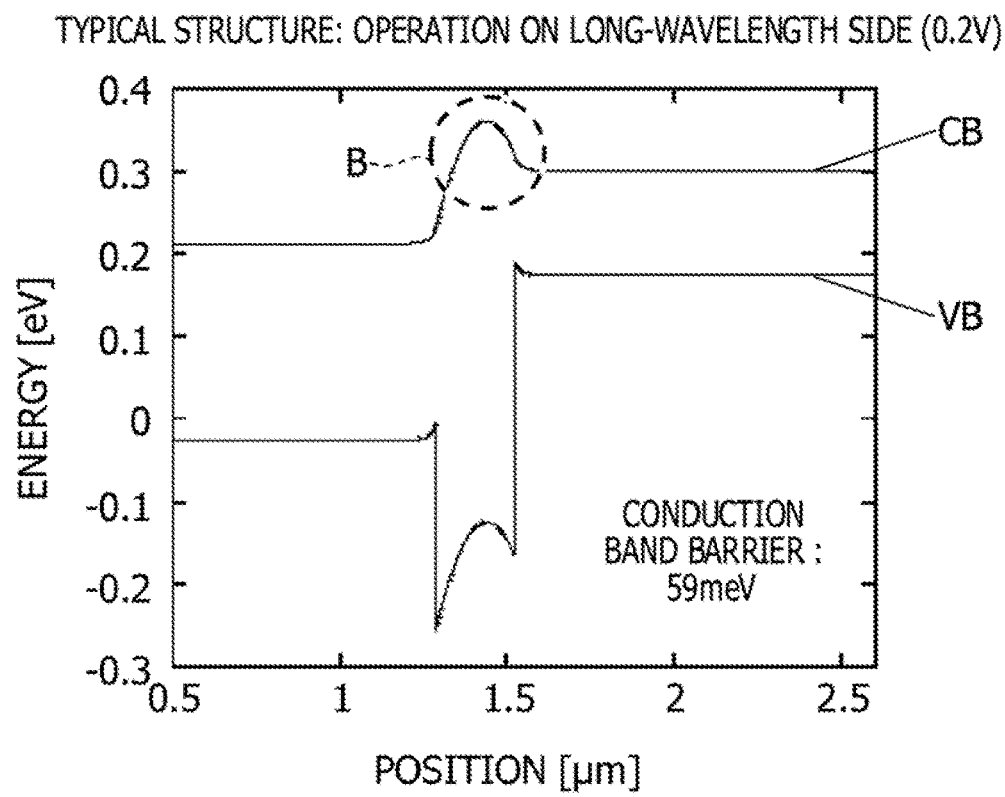
FIG. 8B is an energy band diagram according to calculation by the element structure according to the embodiment.

FIG. 8B illustrates an energy band diagram according to calculation by the typical configuration in FIG. 1 as a comparative example. In FIG. 8B, a doping concentration to two light receiving layers is $1 \times 10^{16}$ cm$^{-3}$ as in FIG. 8A, and a doping concentration to a barrier layer disposed between the two light receiving layers is different from that in FIG. 8A and is $1 \times 10^{16}$ cm$^{-3}$. As indicated by a dashed circle B, a band offset occurs in a conduction band CB at a position corresponding to the barrier layer. This band offset becomes an energy barrier for electrons generated in the light receiving layer on the long-wavelength side. The calculated energy barrier is 59 meV. In order to extract the electrons to the short-wavelength side beyond this barrier, it is needed to increase an applied bias. However, the increase in the applied bias increases the dark current.

On the other hand, in FIG. 8A, by setting the impurity concentrations of the first barrier layer 222, the intermediate filter layer 223, and the second barrier layer 224 to be lower than the impurity concentrations of the first light receiving layer 221 and the second light receiving layer 225, it is possible to set the energy barrier perceived by the electrons to zero meV.

In this way, by disposing the intermediate filter layer 223 having the cutoff wavelength equal to or more than the cutoff wavelength of the first light receiving layer 221 and equal to or less than the cutoff wavelength of the second light receiving layer 225, it is possible to avoid the optical crosstalk between the signals detected by the two-wavelength light receiving element 10 (refer to FIG. 7). Furthermore, by setting the impurity concentrations of the intermediate filter layer 223, the first barrier layer 222, and the second barrier layer 224 to be lower than those of the first light receiving layer 221 and the second light receiving layer 225, a band offset amount or the energy barrier perceived by the operating carrier (electrons in example in FIG. 8A) is smaller than thermal energy of the operating carrier. Therefore, the bias voltage can be reduced, FIGS. 9A to 9G are manufacturing process diagrams of a pixel array in which a large number of light receiving elements 10 according to the embodiment is arranged. In FIGS. 9A to 9G, for convenience of illustration, the manufacturing process is illustrated as focusing on a single pixel positioned at the outermost periphery of the pixel array. However, in actual, a large number of pixels included in the pixel array is formed at once.

Figure 9A:
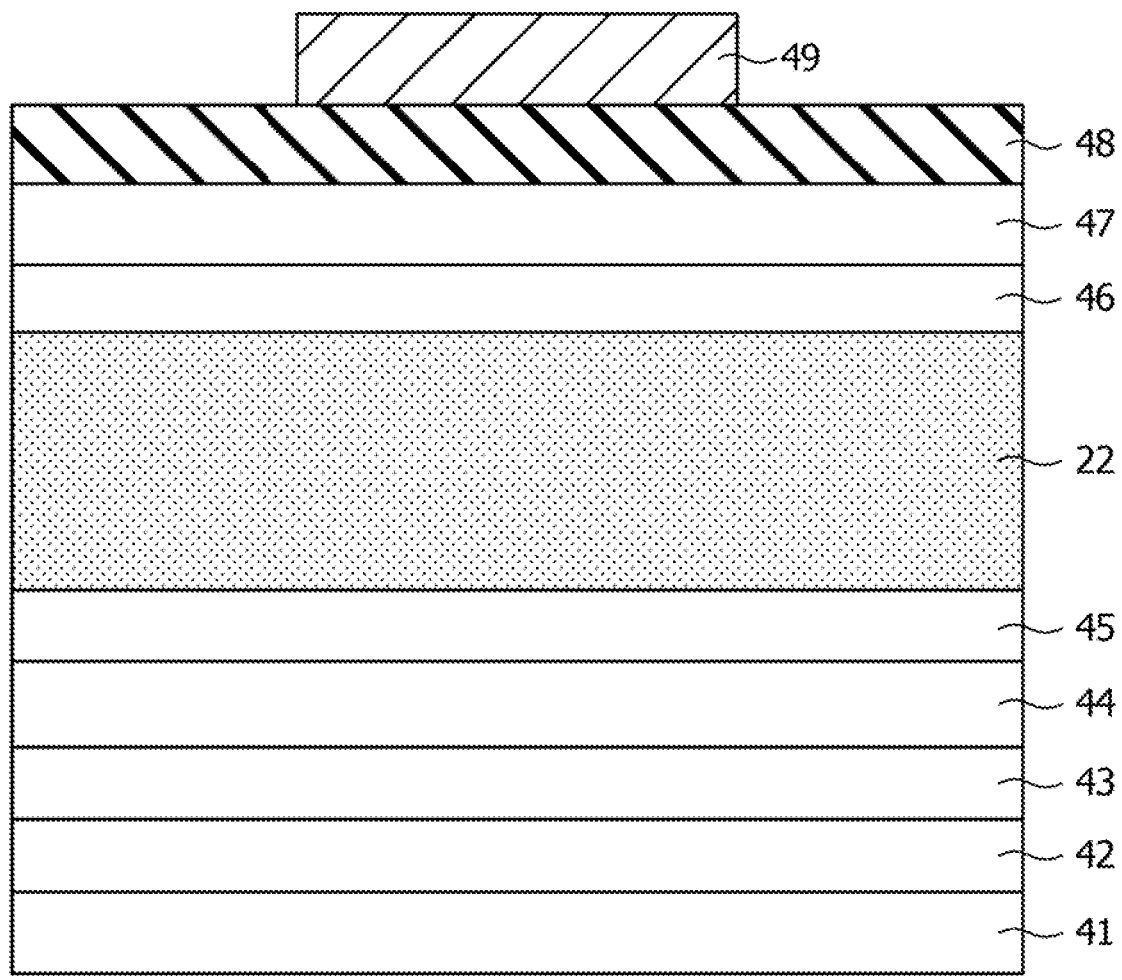
FIG. 9A is a diagram of a pixel array manufacturing process according to the embodiment.

First, in FIG. 9A, laminated layers needed for manufacturing the pixel array are formed on a substrate 41, for example, by Molecular Beam Epitaxy (MBE). As an example, a GaSb buffer layer doped with a p-type impurity at $1 \times 10$ cm$^{-3}$ is epitaxially grown by one pm on the GaSb substrate 41. With this buffer layer, it is possible to reduce roughness on the surface generated when a natural oxide film on the surface of the substrate 41 is removed and to obtain a flatter superlattice layer. However, since a material of the substrate 41 is the same as a material of the buffer layer, the buffer layer and the substrate 41 are not distinguished from each other in FIG. 9A.

Next, as a first etching stopper layer 42 used when the substrate 41 is finally removed, an InAs$_{0.91}$Sb$_{0.09}$ layer doped with the p-type impurity of $1 \times 10^{18}$ cm$^{-3}$ is epitaxially grown by two μm. Subsequently, as a second etching stopper layer 43 used when the InAs$_{0.91}$Sb$_{0.09}$ first etching stopper layer 42 is removed, a GaSb layer doped with the p-type impurity of $1 \times 10^{18}$ cm$^{-3}$ is epitaxially grown by 500 nm. Subsequently, as the third etching stopper layer 44 used upon removal and mesa etching on the GaSb second etching stopper layer 43, an InAs$_{0.91}$Sb$_{0.09}$ layer doped with the p-type impurity of $1 \times 10^{18}$ cm$^{-3}$ is epitaxially grown by one μm. The third etching stopper layer 44 also functions a common contact layer of the pixel array.

Next, a semiconductor electrode layer 45 is formed. The semiconductor electrode layer 45 epitaxially grows the InAs/GaSb superlattice doped with the p-type impurity of $1 \times 10^{18}$ cm$^{-3}$ by about 500 nm at a film thickness ratio of 11/4 (ML). As an example, Be is added to GaSb. The semiconductor electrode layer 45 functions as a lower electrode layer of the upper light absorption layer 22.

Next, the light absorption layer 22 is formed. As illustrated in FIG. 5, in the light absorption layer 22, the first light receiving layer 221, the first barrier layer 222, the intermediate filter layer 223, the second barrier layer 224, and the second light receiving layer 225 are laminated in this order.

As the first light receiving layer 221, an InAs/GaSb superlattice doped with the p-type impurity of $1 \times 10^{16}$ cm$^{-3}$ is epitaxially grown by about two μm at the film thickness ratio of 11/4 (ML). As the first barrier layer 222, an InAs/AlSb superlattice doped with the p-type impurity of $1 \times 10^{15}$ cm$^{-3}$ is epitaxially grown by about 100 nm at the film thickness ratio of 15/4 (ML).

As the intermediate filter layer 223, an InAs/GaSb superlattice doped with the p-type impurity of $1 \times 10^{15}$ cm$^{-3}$ is epitaxially grown by about one μm at the film thickness ratio of 13/5 (ML). As the second barrier layer 224, an InAs/AlSb superlattice doped with the p-type impurity of $1 \times 10^{15}$ cm$^{-3}$ is epitaxially grown by about 100 nm at the film thickness ratio of 15/4 (ML). As the second light receiving layer 225, an InAs/GaSb superlattice doped with the p-type impurity of $1 \times 10^{16}$ 011$^{-3}$ is epitaxially grown by about three pm at the film thickness ratio of 14/7 (ML).

As a result, the light absorption layer 22 including the laminated layers of the first light receiving layer 221, the first barrier layer 222, the intermediate filter layer 223, the second barrier layer 224, and the second light receiving layer 225 is formed. The first light receiving layer 221 has a cutoff wavelength in a middle-wavelength infrared region, and the second light receiving layer 225 has a cutoff wavelength in a long-wavelength infrared region. The intermediate filter layer 223 has a cutoff wavelength in the middle-wavelength to the long-wavelength infrared region. In this example, the first barrier layer 222 and the second barrier layer 224 are barriers against holes.

A semiconductor electrode layer 46 as an upper electrode is formed on the light absorption layer 22. As the semiconductor electrode layer 46, an InAs/GaSb superlattice doped with the p-type impurity of $1 \times 10^{18}$ cm$^{-3}$ is epitaxially grown by about 500 nm at the film thickness ratio of 14/7 (ML). Next, as a cap layer 47, an InAs doped at $1 \times 10^{18}$ cm$^{-3}$ is epitaxially grown by 20 nm. The cap layer 47 also functions as an upper contact layer.

On the laminated layers, an SiON layer 48 having a thickness of 500 nm is formed by the chemical vapor deposition (CVD) method. A resist mask 49 having a pattern shape of a pixel is formed on the SiON layer 48 by lithography.

Figure 9B:
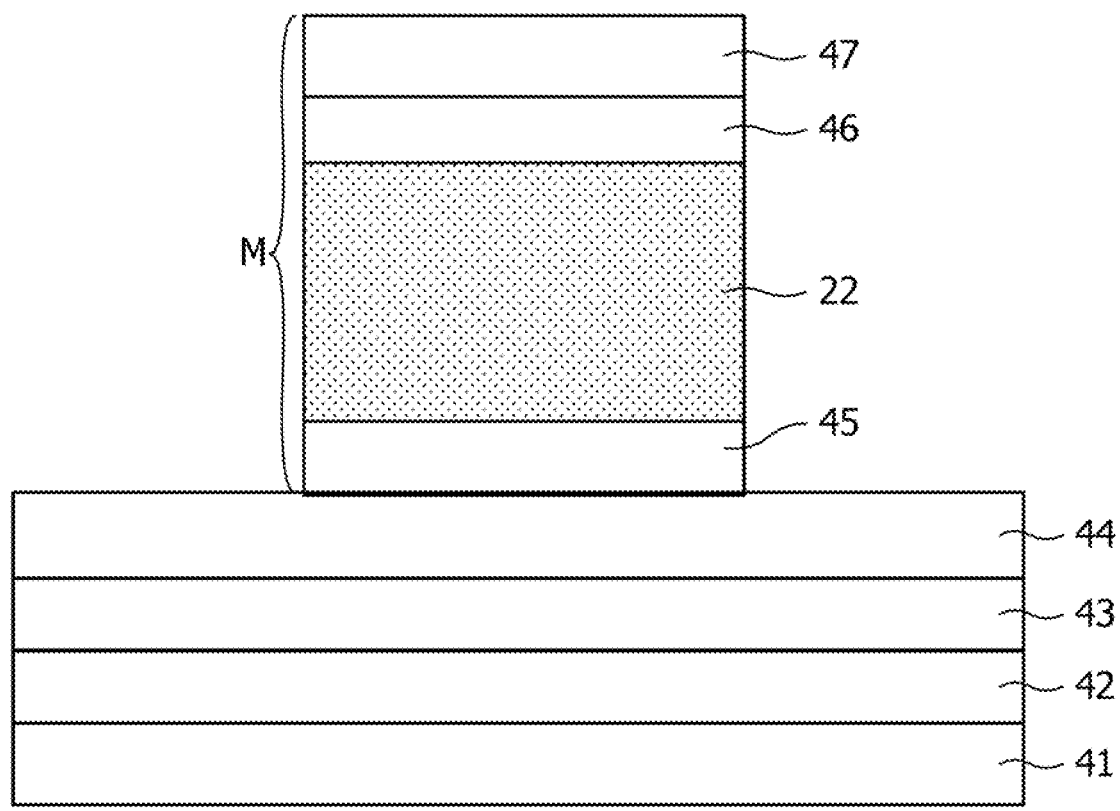
FIG. 9B is a diagram of the pixel array manufacturing process according to the embodiment.

In FIG. 9B, a mesa M to be each pixel is formed on the laminated layers. The mesa M is formed by dry etching using a hard mask. As an example, by using the resist mask 49, reactive ion etching (RIE) using CF$_4$/Ar gas is performed on the SiON layer 48 to form a hard mask. By using the hard mask, the mesa M is formed by etching the laminated superlattice by the RIE method using BC13/Ar gas. At this time, a Ga pulse signal caused by secondary ions or the like is monitored, and an end point of etching is detected on the basis of the reduction in Ga. At the time when the surface of the third etching stopper layer 44 of $InAs_{0.91}Sb_{0.09}$ is exposed, the etching is terminated. Thereafter, about 100 nm of a side wall of the superlattice mesa M is etched by a mixed solution of phosphoric acid, citric acid, hydrogen peroxide water, and water to remove a damaged layer on the side wall of the mesa caused by the RIE. Subsequently, the SiON layer 48 forming the hard mask is removed by using the BHF.

Figure 9C:
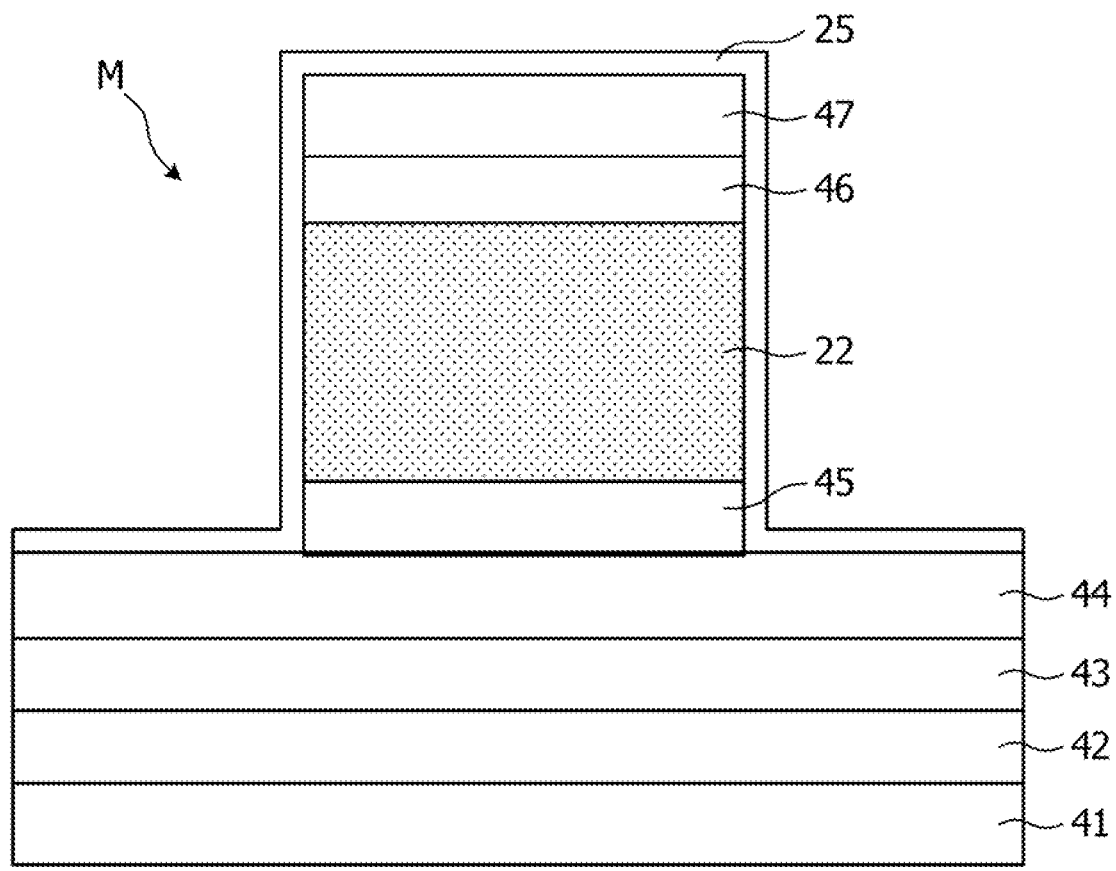
FIG. 9C is a diagram of the pixel array manufacturing process according to the embodiment.

In FIG. 9C, the protection film 25 covering the mesa M is formed on the entire surface. For example, 300 nm of a silicon oxide film is formed by the plasma CVD using $SiH_4/N_2O$ gas and is used as the protection film 25.

Figure 9D:
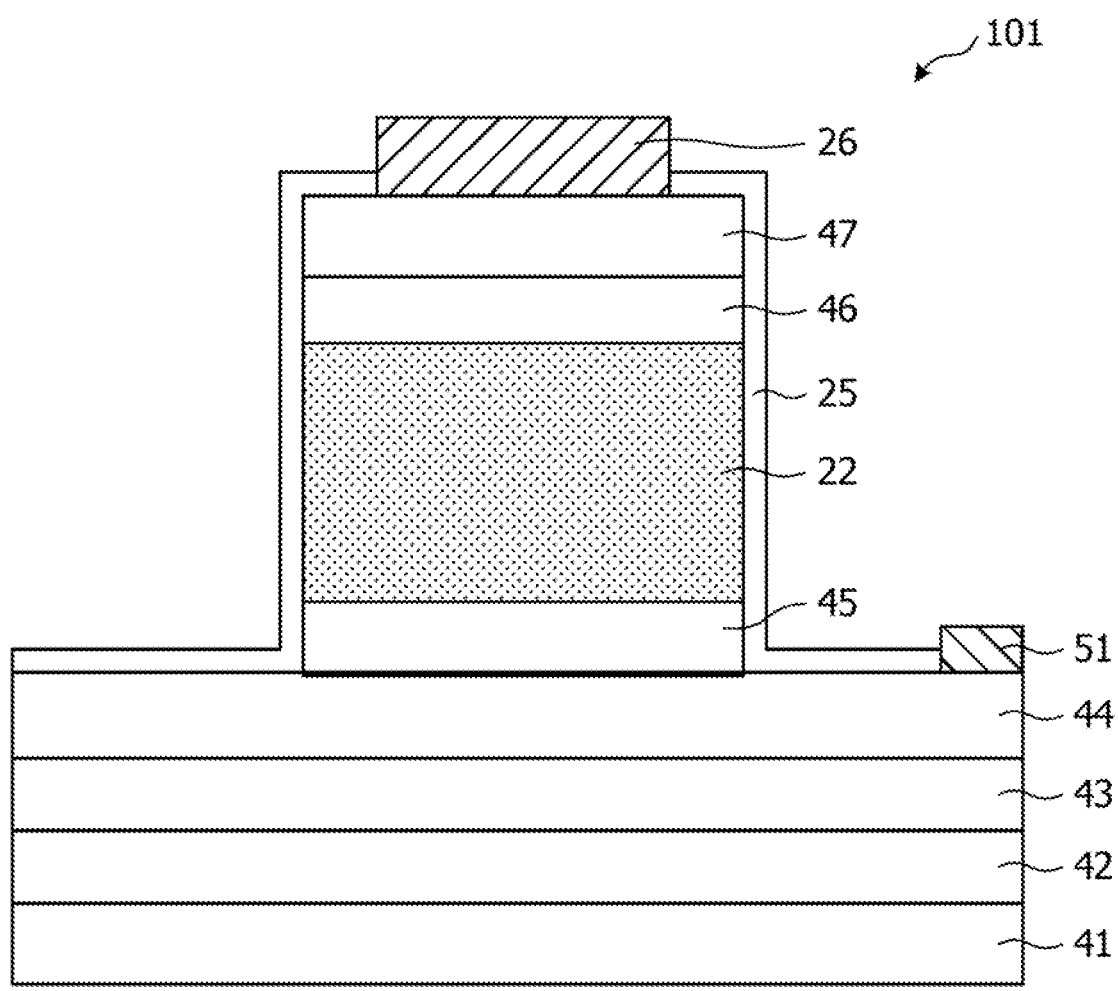
FIG. 9D is a diagram of e pixel array manufacturing process according to the embodiment.

In FIG. 9D, a part of the protection film 25 on the upper surface of each mesa and a part of the protection film 25 covering the upper surface of the third etching stopper layer 44 on the outermost periphery of the pixel array are removed by the lithography and the RIE method to form the upper electrode 26 and a lower electrode 51. As a specific example, in a contact hole obtained by removing the protection film 25 on the upper surface of the mesa and a contact hole obtained by removing the protection film 25 on the upper surface of the third etching stopper layer 44, an electrode pattern having ohmic contact with the cap layer 47 and an electrode pattern having ohmic contact with the third etching stopper layer 44 are respectively formed by lithography. Thereafter, for example, an electrode material of Ti, Pt, or Au is deposited by a vapor deposition method and the shape thereof is processed by a lift-off method so as to form the upper electrode 26 and the lower electrode 51.

As effective pixels in the array, elements excluding the lower electrode 51 are uniformly arranged, and dummy pixels are arranged on the outermost periphery of the array. As described later, the lower electrode 51 is led out to the upper portion of the mesa of the dummy pixel.

Figure 9E:
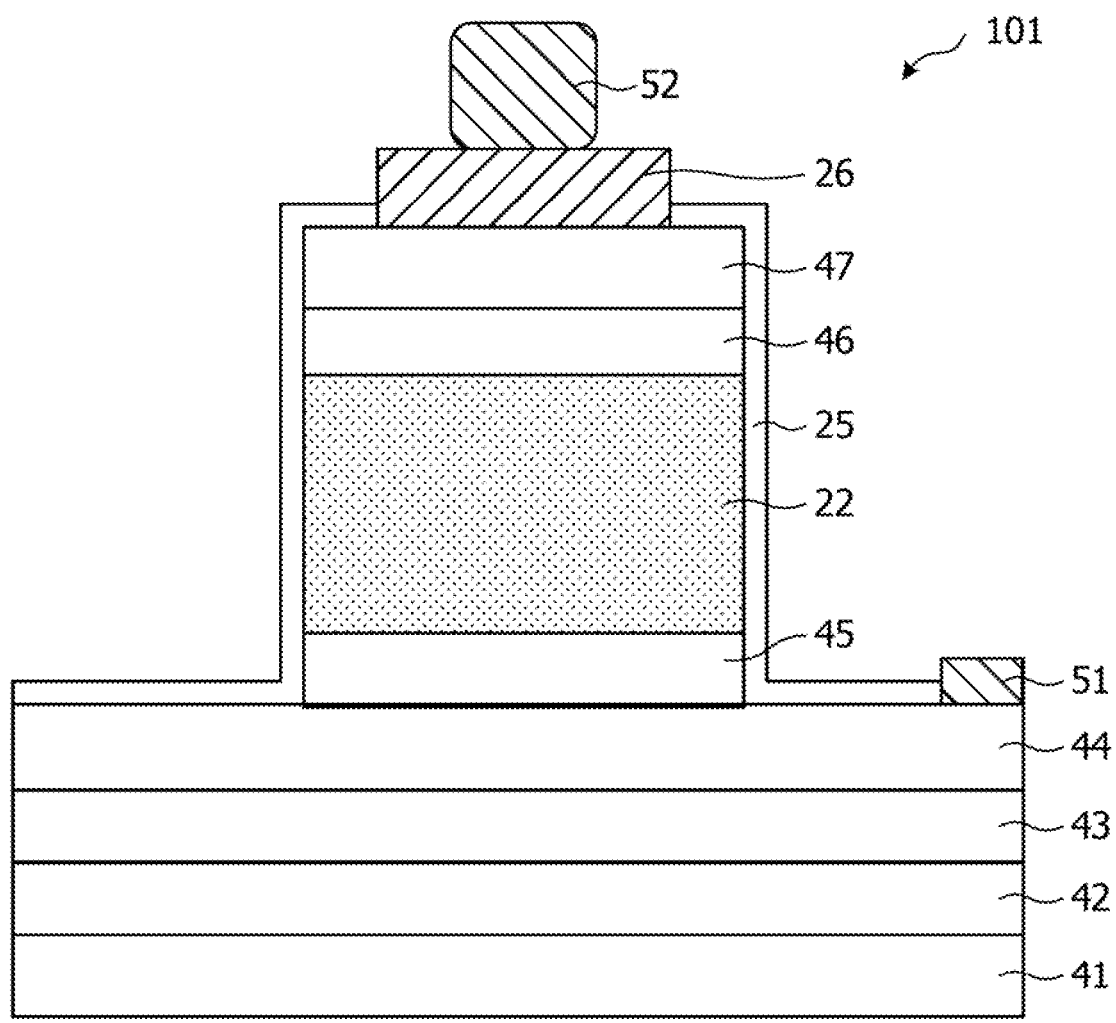
FIG. 9E is a diagram of the pixel array manufacturing process according to the embodiment.

In FIG. 9E, a bump electrode 52 is formed by using a good conductor such as In on the upper electrode 26 by a lift-off method combining the lithography and the vapor deposition method. Although not illustrated, the lower electrode 51 is led out to the upper portion of the mesa by a wire (e.g., a lead wire) formed on the mesa side wall of the dummy pixel and is connected to the bump electrode 52 by the upper electrode of the dummy pixel. The lower electrode 51 is used as a common electrode for the plurality of pixels forming a corresponding column or row of the pixel array.

Figure 9F:
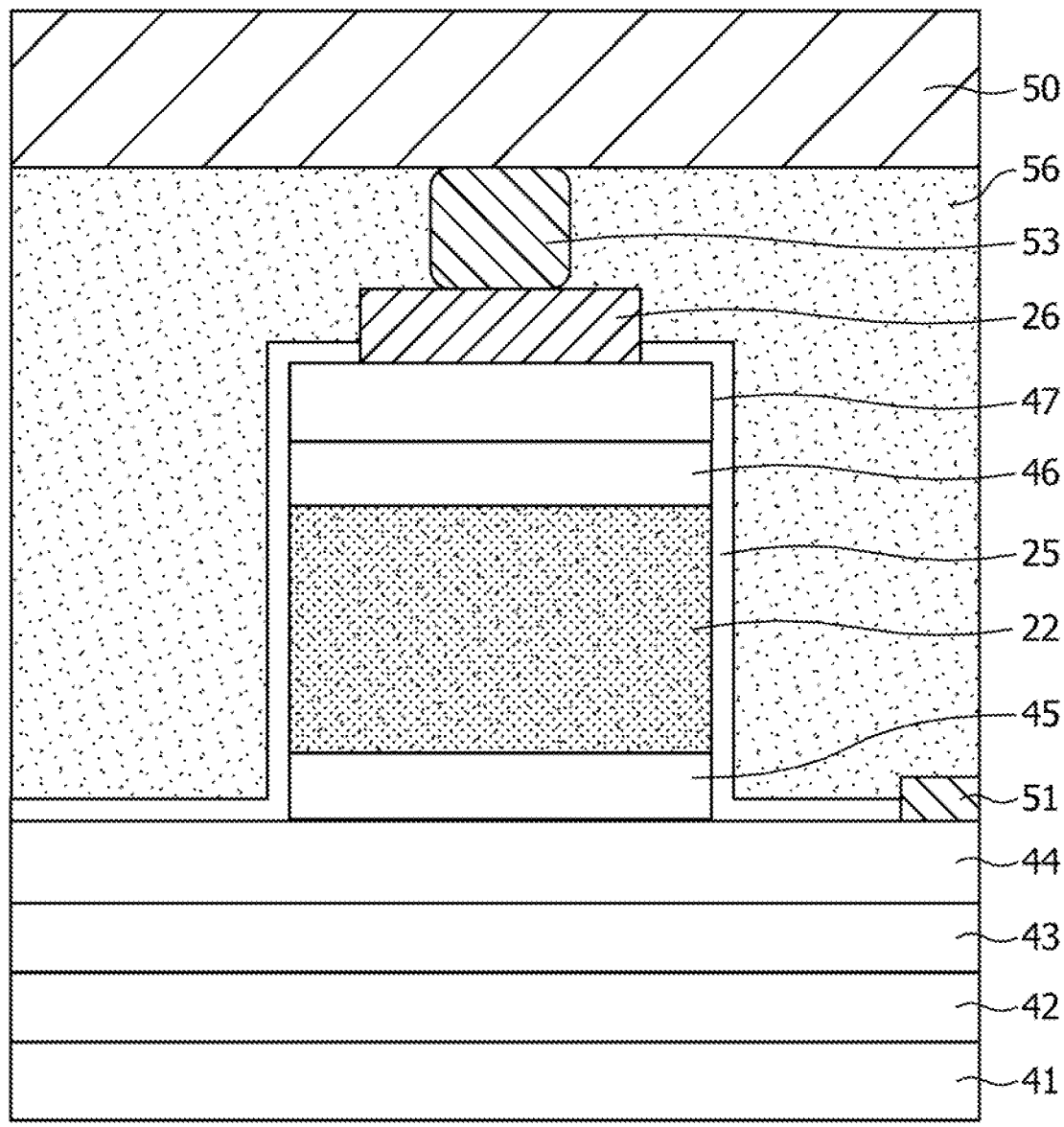
FIG. 9F is a diagram of the pixel array manufacturing process according to the embodiment.

In FIG. 9F, the pixel array on which the bump electrode 52 is formed is flip-chip bonded to a reading circuit 50 on which a connection electrode is formed. In FIG. 9F, for convenience of illustration, the reading circuit 50 is connected to the pixel array in the direction as in FIGS. 9A to 9E. However, the bump electrode 52 of the pixel array is aligned with the connection electrode formed on the reading circuit 50 and is flip-chip connected. With this connection, the substrate including the pixel array and the reading circuit 50 are bonded by a bonding electrode 53, An underfill 56 is filled between the pixel array and the reading circuit 50 coupled by the bonding electrode 53.

Figure 9G:
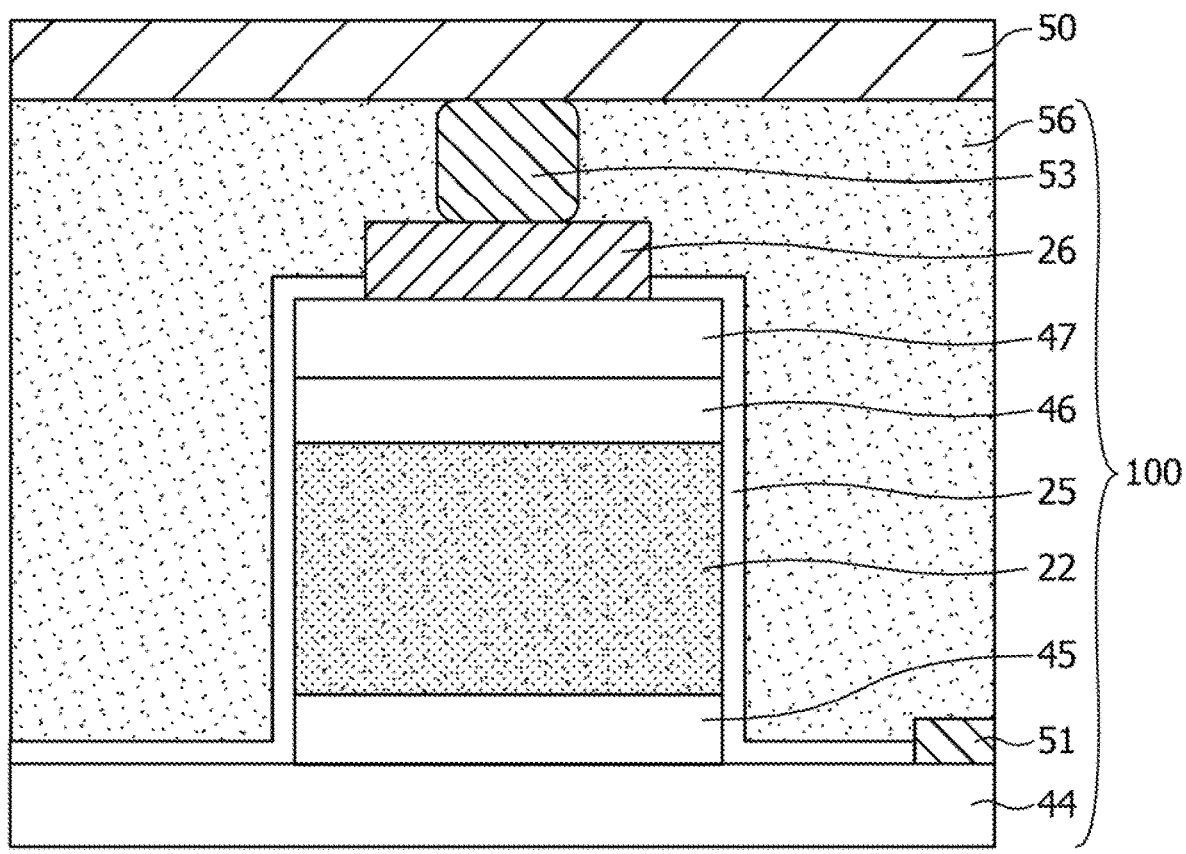
FIG. 9G is a diagram of the pixel array manufacturing process according to the embodiment.

In FIG. 9G, about 600 μm of the back surface of the substrate 41 is removed by grinding, and the substrate 41 is thinned. Subsequently, the remaining substrate 41 is removed by wet etching by using a mixed solution of $HF/CrO_3$ by using the first etching stopper layer 42 of $InAs_{0.91}Sb_{0.09}$. Subsequently, the first etching stopper layer 42 of $InAs_{0.91}Sb_{0.09}$ is removed by wet etching with a mixed solution of phosphoric acid, hydrogen peroxide water, and water by using the GaSb second etching stopper layer 43.

Moreover, the GaSb second etching stopper layer 43 is removed by wet etching with a mixed solution of phosphoric acid, citric acid, hydrogen peroxide water, and water by using the third etching stopper layer 44 of $InAs_{0.91}Sb_{0.09}$. Accordingly, a pixel array 100 is obtained.

Thereafter, an anti-reflection film is formed on the back surface of the third etching stopper layer 44 to be an incident surface of the infrared rays and is mounted on a container so that an infrared detector is completed.

Figure 10:
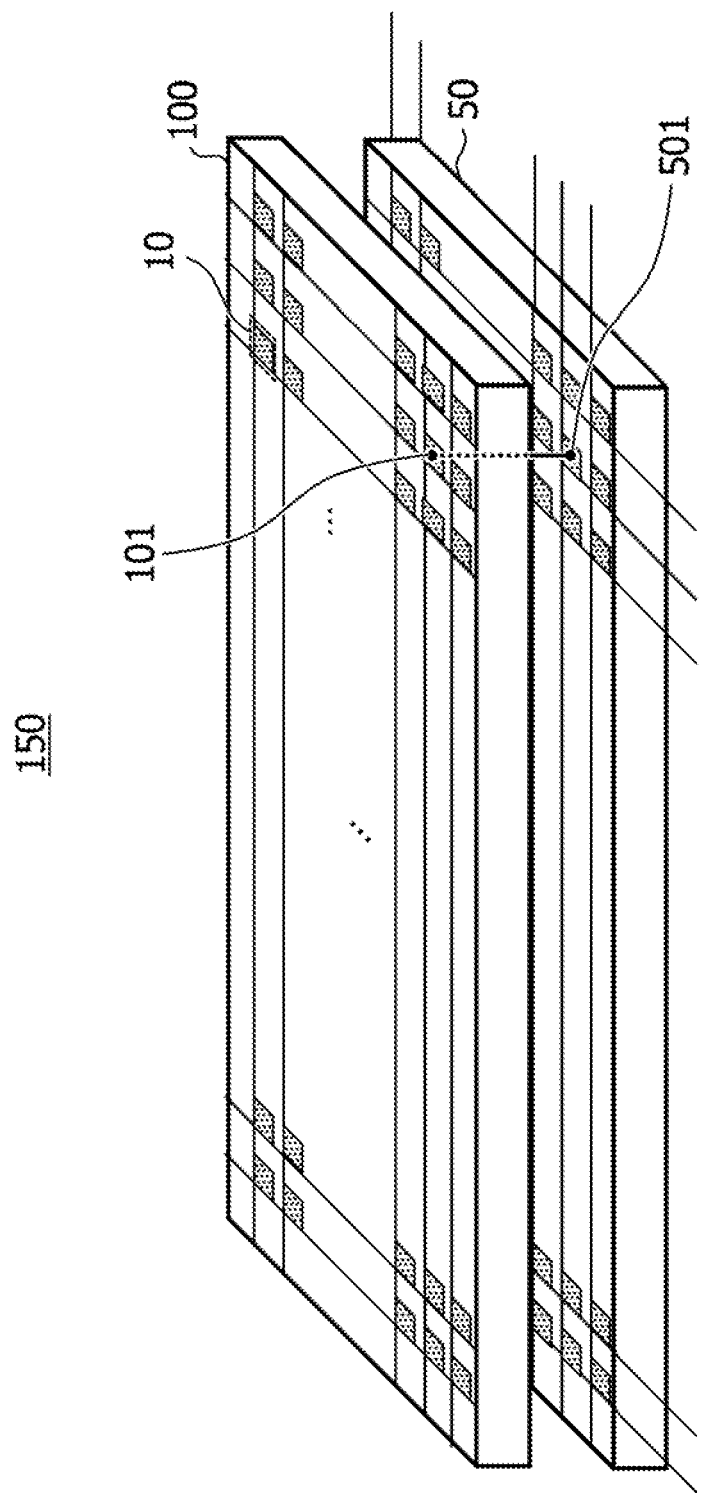
FIG. 10 is a schematic diagram of an infrared detector using the pixel array according to the embodiment.

FIG. 10 is a schematic diagram of an infrared detector 150 according to the embodiment. The infrared detector 150 includes the pixel array 100 and the reading circuit 50. In the pixel array 100, the light receiving elements 10 forming the respective pixels 101 are arranged in an array. Each pixel 101 is electrically connected to a corresponding unit cell 501 formed on the reading circuit 50 by the bonding electrode 53 (refer to FIG. 9G).

When carriers (for example, electrons) generated by light absorbed by the first light receiving layer 221 of the light absorption layer 22 are read, a positive bias is applied from the upper electrode 26 of the selected pixel 101 to the semiconductor electrode layer 46, and the electrons are extracted from the semiconductor electrode layer 46. This charge is accumulated in a capacitor of the corresponding unit cell 501 of the reading circuit 50, and a charge amount is read at a predetermined timing.

When carriers (for example, electrons) generated by light absorbed by the second light receiving layer 225 are read, a positive bias is applied from the lower electrode 51 to the semiconductor electrode layer 45, and electrons are extracted from the semiconductor electrode layer 45. This extracted charge is accumulated in a capacitor of the corresponding unit cell 501 of the reading circuit 50, and a charge amount is read at a predetermined timing.

The intermediate filter layer 223 is disposed between the first light receiving layer 221 and the second light receiving layer 225, the first barrier layer 222 is inserted between the first light receiving layer 221 and the intermediate filter layer 223, and the second barrier layer 224 is inserted between the intermediate filter layer 223 and the second light receiving layer 225 With this configuration, the optical crosstalk between the first light receiving layer 221 and the second light receiving layer 225 is suppressed, and the S/N ratio is improved.

Furthermore, by setting the impurity concentrations of the first barrier layer 222, the intermediate filter layer 223, and the second barrier layer 224 to be lower than those of the first light receiving layer 221 and the second light receiving layer 225, it is possible to reduce the energy barrier perceived by the operating carrier and reduce the bias voltage. This can reduce the dark current and contribute to improve the S/N ratio.

Figure 11:
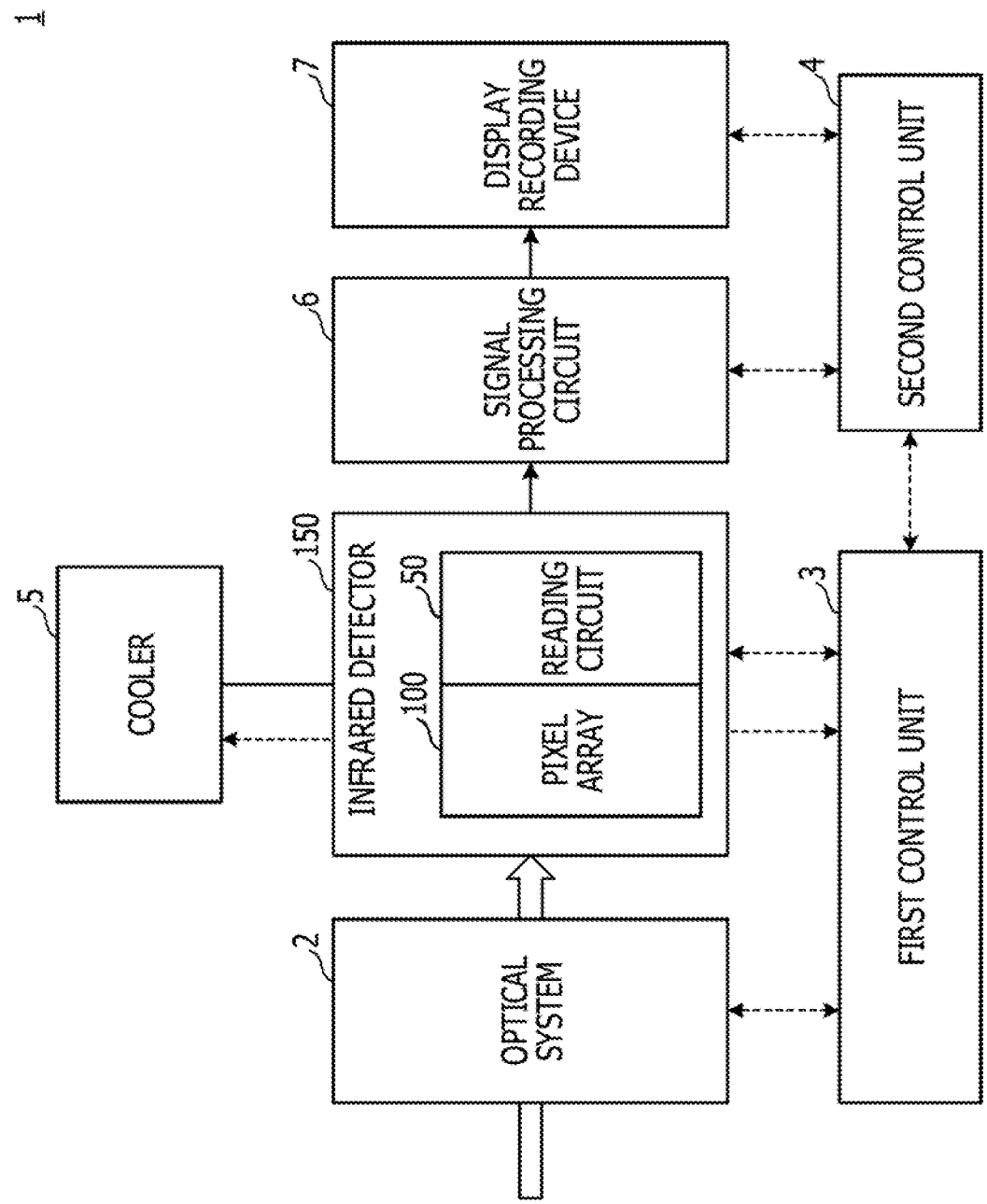
FIG. 11 is a schematic diagram of an imaging device using the infrared detector according to the embodiment.

FIG. 11 is a system configuration diagram of an imaging device 1 using the infrared detector 150. The imaging device 1 includes the infrared detector 150, an optical system 2 disposed on a light incident side of the infrared detector 150, a signal processing circuit 6 connected to the reading circuit 50 of the infrared detector 150, and a display recording device 7. Furthermore, a first control unit 3 that controls the optical system 2 and the infrared detector 150 and a second control unit 4 that controls the signal processing circuit 6 and the display recording device 7 are included. The entire infrared detector 150 may be disposed in a cooler 5.

The signal processing circuit 6 may be a dedicated signal processing circuit such as a Digital Signal Processor (DSP), a logic device such as a Field Programmable Gate Array (FPGA), or a combination of a dedicated image processing processor and these devices. The signal processing circuit 6 executes correction processing or the like including arithmetic processing and sensitivity correction by using infrared rays detected in the first light receiving layer 221 of each pixel and infrared rays detected in the second light receiving layer 225 and generates an image signal. The generated image signal is supplied to the display recording device 7, and an image according to incident infrared light to each pixel 101 is displayed and recorded.

Since the optical crosstalk is suppressed and the S/N ratio is improved, the imaging device 1 can display an image of an object to be measured with high definition. Since the imaging device 1 can be applied to a security system, an unmanned exploration system, or the like and detects infrared light, the imaging device 1 can be effectively applied to a nighttime monitoring system.

The embodiment and the modification example have been described above on the basis of the specific configuration example. However, the present embodiment is not limited to the configurations and the methods described above. Changes and substitutions can be appropriately made within a range an effect of the improvement of the S/N ratio can be obtained. For example, in the embodiment, the InAs/GaSb superlattice is used as light reception units of the middle-wavelength infrared rays and the long-wavelength infrared rays. However, the present invention is not limited to this example, and an InAs/GaInSb superlattice, an InAs/InAsSb superlattice, or the like may be used. Furthermore, the first barrier layer and the second barrier layer are not limited to InAs/AlSb, and a superlattice having a band gap wider than those of the first light receiving layer and the second light receiving layer, for example, an InAs/GaSb/AlSb/GaSb superlattice or the like may be used.

In the embodiment, a case of the p-type light absorption layer 22 has been described, and the first barrier layer and the second barrier layer are used as the barrier layers against the holes. However, an n-type light absorption layer 22 may be used by using Si, Te, or the like as a dopant. In that case, as a barrier layer against electrons, $Al_xGa_{1-x}Sb$ or the like may be used for the first barrier layer and the second barrier layer. The p-type impurity added to the light absorption layer 22 is not limited to Be, and Zn or the like may be used.

It is not needed for the impurities added to the light absorption layer 22 to be uniformly introduced to all the superlattices, and the impurities may be introduced every several layers. For example, in a case where the impurity concentrations of the first barrier layer, the intermediate filter layer, and the second barrier layer are set to be lower than those of the first light receiving layer and the second light receiving layer, the number of superlattice layers to which impurities are not added may be increased.

In a case where the p-type light absorption layer is used (in a case where operating carrier is electron), the first light receiving layer, the first barrier layer, the intermediate filter layer, the second barrier layer, and the second light receiving layer may be formed by a superlattice forming by combining two or more of InAs, GaSb, and AlSb.

In a case where the n-type light absorption layer is used (in a case where operating carrier is hole), the first light receiving layer, the intermediate filter layer, and the second light receiving layer may be formed by a superlattice formed by combining two or more of InAs, GaSb, and AlSb, and the first barrier layer and the second barrier layer may be formed by $Al_xGa_{1-x}Sb$.

The lamination method is not limited to the molecular beam epitaxy (MBE) method, and the metal organic chemical vapor deposition (MOCVD) method and other method capable of manufacturing a lamination structure may be used.

A shutter may be disposed on the incident side of the infrared detector 150, for example, between the optical system 2 and the pixel array 100. A temperature sensor may be provided in the infrared detector 150 or the cooler 5. Along the outer periphery of the reading circuit 50, circuits such as a vertical scanning circuit (shift register), a horizontal scanning circuit (shift register), a horizontal reading circuit, or a noise canceler may be disposed. The first control unit 3 and the second control unit 4 that control the operation of the imaging device 1 may be implemented by a single processor.

In any case, by inserting the intermediate filter layer having the cutoff wavelength equal to or more than the cutoff wavelength of the first light receiving layer and equal to or less than the cutoff wavelength of the second light receiving layer between the first light receiving layer and the second light receiving layer, it is possible to suppress the optical crosstalk and improve the S/N ratio.

Furthermore, by setting the impurity concentrations of the intermediate filter layer, the first barrier layer, and the second barrier layer to be lower than the impurity concentrations of the first light receiving layer and the second light receiving layer, it is possible to reduce the energy barrier perceived by the operating carrier and reduce the bias voltage. Accordingly, it is possible to suppress the dark current and contribute to improve the S/N ratio.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An infrared detector comprising:
   a first light receiving layer having a first cutoff wavelength;
   a second light receiving layer having a second cutoff wavelength longer than the first cutoff wavelength;
   an intermediate filter layer having a third cutoff wavelength that is the same as or longer than the first cutoff wavelength and the same as or shorter than the second cutoff wavelength, the intermediate filter layer being disposed between the first light receiving layer and the second light receiving layer;
   a first barrier layer disposed between the first light receiving layer and the intermediate filter layer; and
   a second barrier layer disposed between the second light receiving layer and the intermediate filter layer,
   impurity concentrations of the intermediate filter layer, the first barrier layer, and the second barrier layer are lower than impurity concentrations of the first light receiving layer and the second light receiving layer.

2. The infrared detector according to claim 1, wherein energy band gaps of the first barrier layer and the second barrier layer are larger than energy band gaps of the first light receiving layer, the intermediate filter layer, and the second light receiving layer.

3. The infrared detector according to claim 1, wherein operating carriers generated in the first light receiving layer and the second light receiving layer are n-type carriers, and the first light receiving layer, the second light receiving layer, the first barrier layer, the second barrier layer, and the intermediate filter layer are formed by using a superlattice including two or more materials selected from among InAs, GaSb, and AlSb.

4. The infrared detector according to claim 3, wherein impurities are ununiformly introduced into a repetition layer forming the superlattice.

5. The infrared detector according to claim 1, wherein
operating carriers generated in the first light receiving layer and the second light receiving layer are p-type carriers, and the first light receiving layer, the intermediate filter layer, and the second light receiving layer are formed by using a superlattice including two or more materials selected from among InAs, GaSb, and AlSb, and
the first barrier layer and the second barrier layer are formed by using $Al_xGa_{1-x}Sb$.

6. The infrared detector according to claim 1, further comprising:
a pixel array in which a plurality of light receiving elements, in which the first light receiving layer, the first barrier layer, the intermediate filter layer, the second barrier layer, and the second light receiving layer are laminated in this order, is arranged; and
a reading circuit bonded to the pixel array.

7. An infrared detector comprising:
a first light receiving layer having a first cutoff wavelength;
a second light receiving layer having a second cutoff wavelength longer than the first cutoff wavelength;
an intermediate filter layer having a third cutoff wavelength that is the same as or longer than the first cutoff wavelength and the same as or shorter than the second cutoff wavelength, the intermediate filter layer being disposed between the first light receiving layer and the second light receiving layer;
a first barrier layer disposed between the first light receiving layer and the intermediate filter layer; and
a second barrier layer disposed between the second light receiving layer and the intermediate filter layer,
the first light receiving layer, the second light receiving layer, the intermediate filter layer, the first barrier layer, and the second barrier layer have a same conductivity type.

8. An imaging device comprising:
an infrared detector; and
a signal processing circuit,
wherein the infrared detector includes
a first light receiving layer having a first cutoff wavelength,
a second light receiving layer having a second cutoff wavelength longer than the first cutoff wavelength,
an intermediate filter layer having a third cutoff wavelength that is the same as or longer than the first cutoff wavelength and the same as or shorter than the second cutoff wavelength, the intermediate filter layer being disposed between the first light receiving layer and the second light receiving layer,
a first barrier layer disposed between the first light receiving layer and the intermediate filter layer,
a second barrier layer disposed between the second light receiving layer and the intermediate filter layer,
a pixel array in which a plurality of light receiving elements, in which the first light receiving layer, the first barrier layer, the intermediate filter layer, the second barrier layer, and the second light receiving layer are laminated in this order, is arranged, and
a reading circuit bonded to the pixel array,
the first light receiving layer, the second light receiving layer, the intermediate filter layer, the first barrier layer, and the second barrier layer have a same conductivity type,
the signal processing circuit is configured to be connected to an output of the reading circuit.

* * * * *